(12) United States Patent
Venema

(10) Patent No.: US 7,460,309 B2
(45) Date of Patent: Dec. 2, 2008

(54) VARIABLE LENS AND EXPOSURE SYSTEM

(75) Inventor: Willem J. Venema, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 11/740,121

(22) Filed: Apr. 25, 2007

(65) Prior Publication Data

US 2007/0253070 A1 Nov. 1, 2007

Related U.S. Application Data

(62) Division of application No. 11/106,722, filed on Apr. 15, 2005, now Pat. No. 7,221,514.

(51) Int. Cl.
*G02B 3/12* (2006.01)

(52) U.S. Cl. .................. 359/666; 359/626; 359/649

(58) Field of Classification Search ......... 359/665–666, 359/619, 626
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,379,867 B1 | 4/2002 | Mei et al. | |
| 6,509,955 B2 | 1/2003 | Mei et al. | |
| 6,649,312 B1 * | 11/2003 | Chari et al. | .......... 430/21 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,909,555 B2 | 6/2005 | Wohlstadter | |
| RE39,874 E * | 10/2007 | Berge et al. | ......... 359/666 |
| 2004/0021802 A1 | 2/2004 | Yoshino et al. | |

(Continued)

FOREIGN PATENT DOCUMENTS

WO WO 98/33096 A1 7/1998

(Continued)

OTHER PUBLICATIONS

Ren, H. et al., "Tunable microlens arrays using polymer network liquid crystal," *Optics Communications 230*, pp. 267-271 (2004).

(Continued)

*Primary Examiner*—Jordan M. Schwartz
(74) *Attorney, Agent, or Firm*—Sterne, Kessler, Goldstein & Fox P.L.L.C.

(57) ABSTRACT

A lithography apparatus comprising variable lenses is described. These variable lenses are included in a microlens array. At least some of the lenses have two or more immiscible liquids whose optical properties can be varied, for example, by an application of a voltage.

10 Claims, 6 Drawing Sheets

U.S. PATENT DOCUMENTS

| | | | |
|---|---|---|---|
| 2004/0041104 A1 | 3/2004 | Liebregts et al. | |
| 2004/0130561 A1 | 7/2004 | Jain | |
| 2004/0174610 A1* | 9/2004 | Aizenberg et al. | 359/665 |
| 2005/0007572 A1 | 1/2005 | George et al. | |
| 2005/0024730 A1 | 2/2005 | Aizenberg et al. | |
| 2005/0285835 A1* | 12/2005 | Jessop | 345/89 |
| 2006/0215273 A1* | 9/2006 | Kuiper et al. | 359/666 |
| 2006/0245072 A1 | 11/2006 | Venema | |

FOREIGN PATENT DOCUMENTS

| | | |
|---|---|---|
| WO | WO 98/38597 A2 | 9/1998 |
| WO | WO 98/38597 A3 | 9/1998 |
| WO | WO 03/069380 A1 | 8/2003 |
| WO | WO 2004/099829 A2 | 11/2004 |
| WO | WO 2004/099829 A3 | 11/2004 |
| WO | WO 2004/102250 A1 | 11/2004 |
| WO | WO 2005/006029 A1 | 1/2005 |

OTHER PUBLICATIONS

Ren, H. et al., "Polymer network liquid crystals for tunable microlens arrays," *Journal of Physics D: Applied Physics 37*, pp. 400-403 (2004).

Kuiper, S. and Hendriks, B.H.W., "Variable-focus liquid lens for miniature cameras," *Applied Physics Letters*, vol. 85, No. 7, pp. 1128-1130 (Aug. 16, 2004).

Hendriks, B. and Kuiper, S., "Through a Lens Sharply: Tiny shape-shifting lenses that mimic the lens of the human eye could transform the multibillion-dollar camera-phone market," from http://www.spectrum.ieee.org/WEBONLY/publicfeature/dec04/1204fox.html, 21 pages (Modified: Nov. 30, 2004).

* cited by examiner

FIG. 1
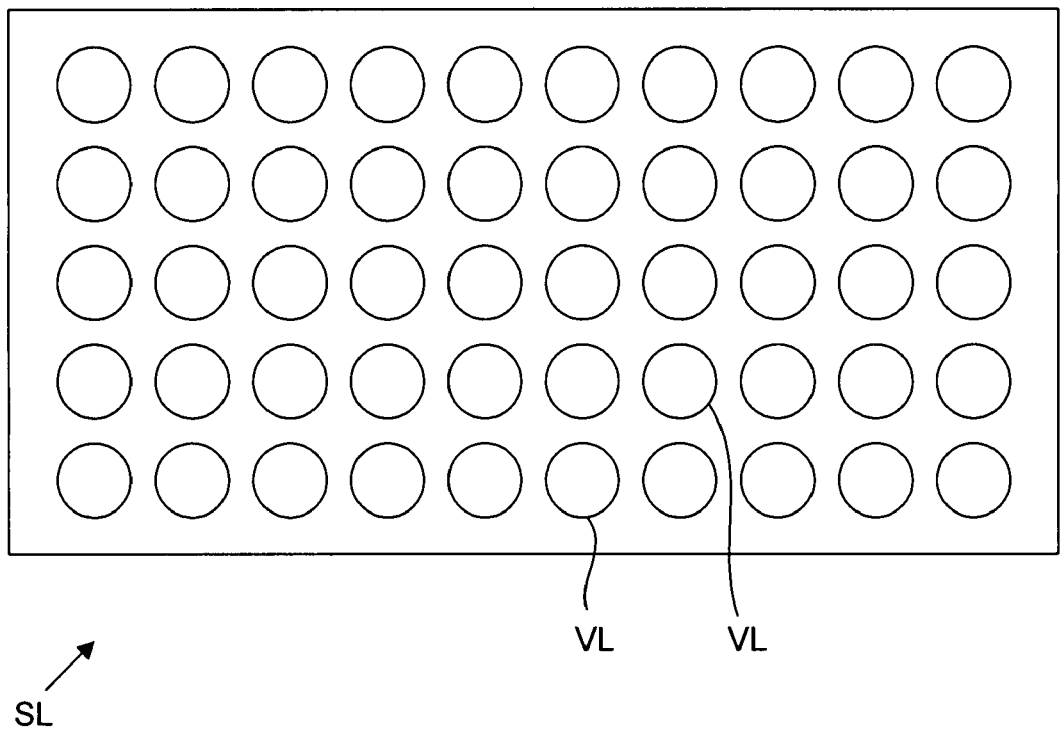
SL, VL, VL
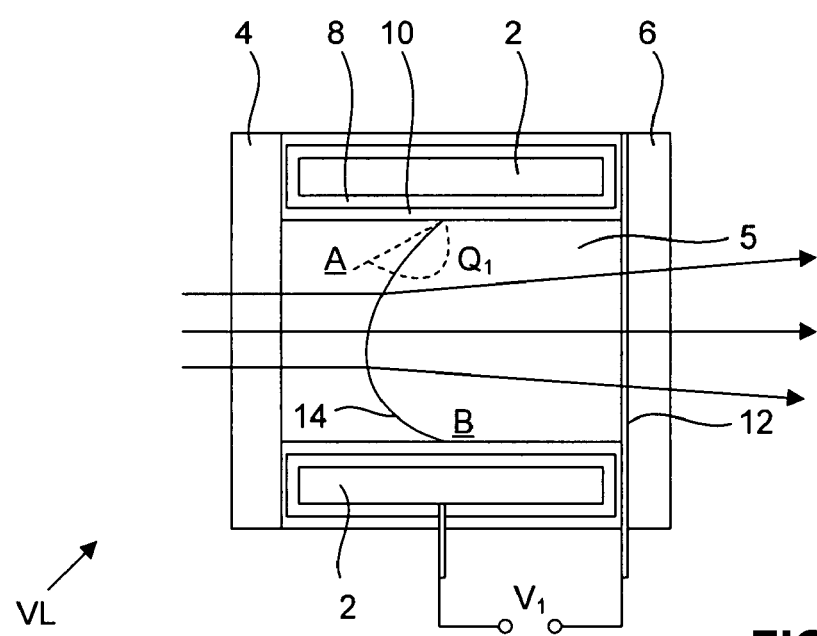
VL
FIG. 2

VARIABLE LENS AND EXPOSURE SYSTEM

CROSS REFERENCE TO RELATED APPLICATIONS

The present application is a divisional patent application of U.S. patent application Ser. No. 11/106,722, filed on Apr. 15, 2005, which is incorporated herein by reference in its entirety.

FIELD

The present invention relates to a set of lenses, wherein the set includes one or more variable lenses. Also, the present invention relates to an exposure system, e.g. a lithographic apparatus, comprising a set of lenses, wherein the set includes one or more variable lenses.

BACKGROUND

In optical lithography, a desired pattern may be created on a substrate by providing a resist layer on the substrate and exposing this layer to a patterned beam of radiation. The pattern thereby created in the resist layer may be used in subsequent procedures (e.g. etching, metal deposition, etc.) to create a desired structure in or on the substrate, for instance a microcircuit structure. Patterning the beam of radiation may be done, e.g., with a reticle or a micromirror device, and generally the patterned beam of radiation is first guided through a lens system before reaching the substrate.

Conventionally, the lens system was such that each lens would sequentially receive the patterned beam of radiation, i.e. the beam was first passed through (or reflected by) lens 1, then through (or reflected by) lens 2, etc. More recently, however, it has been proposed to further add to certain systems a set of lenses constructed and arranged such that the cross section of the patterned beam impinges on a plurality of lenses in the set. An example of such a set of lenses is for instance a microlens array (MLA). See, e.g., U.S. Pat. No. 6,133,986.

A disadvantage of using conventional MLAs in lithographic apparatus, however, is that the lenses are not individually controllable. E.g., if several of the lenses in the MLA are out of focus (for instance because the substrate is warped or because of errors in manufacturing the MLA), it is cumbersome if not impossible to correct for this focal deficiency without negatively affecting the focus of the other lenses in the MLA.

Therefore, what is needed is an exposure system comprising a set of lenses, wherein the set of lenses comprises variable lenses. Furthermore, what is needed is a set of lenses comprising variable lenses.

SUMMARY

In an embodiment, there is provided an exposure apparatus, e.g. a lithography apparatus, comprising a variable lens.

In an embodiment, there is provided an exposure apparatus comprising:
(i) a patterning device constructed and arranged to pattern a beam of radiation;
(ii) a set of lenses to receive the patterned beam of radiation, the set of lenses being arranged such that a cross-section of the patterned beam of radiation exposes a plurality of lenses in said set;
wherein said set of lenses includes at least one variable lens.

In an embodiment, there is provided an apparatus comprising
an illumination system configured to provide a radiation beam;
an array of individually controllable elements capable of patterning the cross-section of the radiation beam;
a substrate table constructed to support a substrate; and
a projection system configured to project the patterned radiation beam onto a target portion of the substrate,
wherein said projection system comprises a set of lenses lens arranged such that different sections in said array of individually controllable elements in said array of individually controllable elements are optically associated with different lenses in said set of lenses; and wherein said set of lenses comprises a variable lens.

In an embodiment, there is provided a lithography apparatus comprising a microlens array, wherein said microlens array comprises variable lenses.

In an embodiment, there is provided a matrix of lenses, said matrix including lenses comprising a first liquid and a second liquid, said first liquid and said second liquid being substantially immiscible and having different refractive indices.

BRIEF DESCRIPTION OF THE DRAWINGS

FIG. 1 depicts an embodiment of a lens array;

FIGS. 2-4 depict embodiments of a variable lens;

DETAILED DESCRIPTION

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

Set of Lenses

In an embodiment, the present invention provides a set of lenses comprising one or more variable lenses, i.e. lenses in which the focal position of the individual lenses (e.g. the focal length) can be controllably adjusted, e.g. through electrowetting, without having to mechanically move the lens itself or deform the lens set holder. Lenses and electrowetting are mentioned in, e.g., WO 03/069380; WO 04/099829; and WO 05/006029.

FIG. 1 shows a set of lenses comprising variable lenses VL. In an embodiment, the set comprises at least 10 lenses, e.g. at least 100 lenses, at least 1000 lenses, at least 10000 lenses, at least 100000 lenses, or at least 1000000 lenses. In an embodiment, the set is a microlens array. In an embodiment, the majority of lenses in the set are variable lenses, e.g. about all lenses in the set. In an embodiment, the set comprises at least 10 variable lenses, e.g. at least 100 variable lenses, at least 1000 variable lenses, at least 10000 variable lenses, at least 100000 variable lenses, or at least 1000000 variable lenses. In an embodiment, for instance the embodiment shown in FIG. 1, the lenses are arranged as a matrix. In an embodiment, the matrix is at least a 2×2 matrix, such as at least a 5×5 matrix, at least a 10×10 matrix, at least a 50×50 matrix, at least a 100×100 matrix, at least a 150×250 matrix, or at least a 500×500 matrix.

Figure 3:
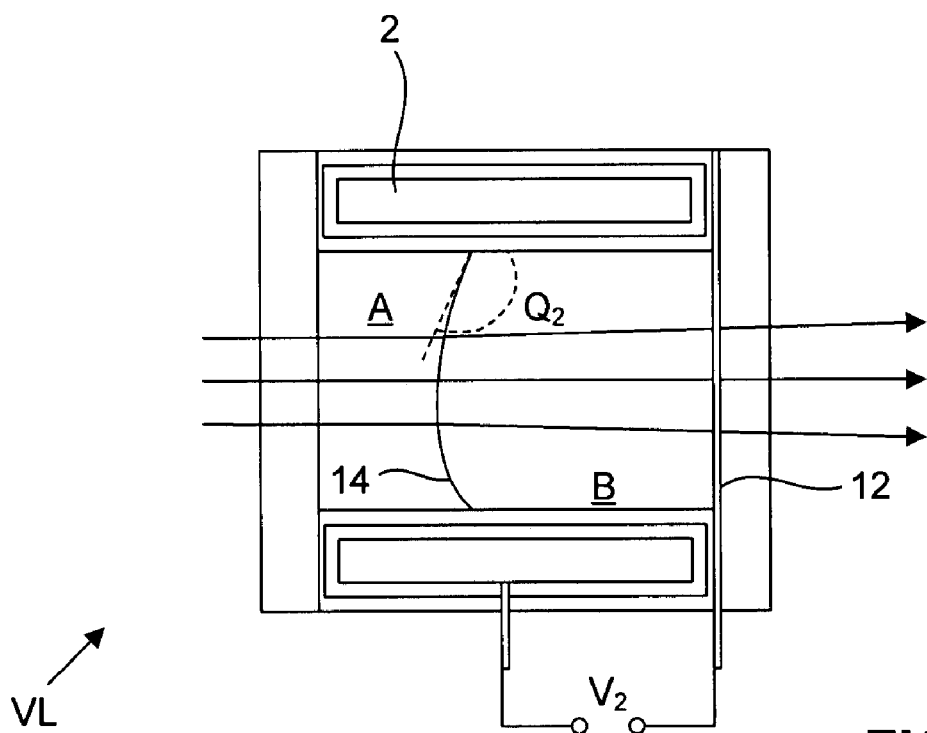
Figure 4:
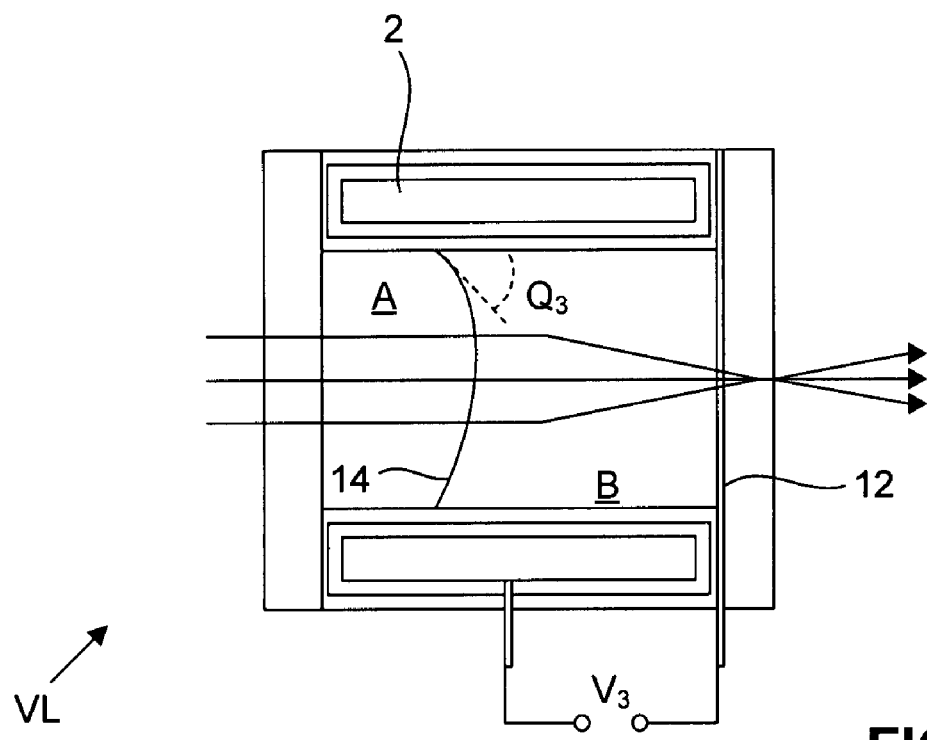

FIGS. 2-4 show examples of variable lenses VL in more detail. FIGS. 2 to 4 show a variable lens comprising a cylindrical first electrode 2 forming a capillary tube, sealed by means of a transparent front element 4 and a transparent back element 6 to form a fluid chamber 5 containing two fluids. The electrode 2 may be a conducting coating applied on the inner wall of a tube. In an embodiment, the two fluids consist of two non-miscible liquids in the form of an electrically insulating first liquid $\underline{A}$, such as a silicone oil or an alkane, referred to herein further as "the oil", and an electrically conducting second liquid $\underline{B}$, such as water containing a salt solution. In an embodiment, the two liquids are arranged to have an equal density, so that the lens functions independently of orientation, i.e. without dependence on gravitational effects between the two liquids. This may be achieved by appropriate selection of the first liquid constituent; for example alkanes or silicon oils may be modified by addition of molecular constituents to increase their density to match that of the salt solution.

Depending on the choice of the oil used, the refractive index of the oil may vary. In an embodiment, the refractive index of the oil is in the range of 1.25 and 1.60. Likewise, depending on the amount of salt added, the salt solution may vary in refractive index. In an embodiment, the refractive index of the salt solution is in the range of 1.33 and 1.48. The fluids in this embodiment are selected such that the first fluid-$\underline{A}$ has a higher refractive index than the second fluid $\underline{B}$.

The first electrode 2 has a cylindrical shape and may be formed, e.g., from a metallic material and is coated by an insulating layer 8, formed for example of parylene. The insulating layer is coated with a fluid contact layer 10, which may reduce the hysteresis in the contact angle of the meniscus with the cylindrical wall of the fluid chamber. In an embodiment, the fluid contact layer is formed from an amorphous fluorocarbon such as TeflonAF1600 produced by DuPont. In an embodiment, the wettability of the fluid contact layer by the second fluid is substantially equal on both sides of the intersection of the meniscus 14 with the fluid contact layer 10 when no voltage is applied between the first and second electrodes.

A second, annular electrode 12 is arranged at one end of the fluid chamber, in this case, adjacent the back element. The second electrode 12 is arranged with at least one part in the fluid chamber such that the electrode acts on the second fluid $\underline{B}$.

The two fluids $\underline{A}$ and $\underline{B}$ are non-miscible so as to tend to separate into two fluid bodies separated by a meniscus 14. When no voltage is applied between the first and second electrodes, the fluid contact layer has a higher wettability with respect to the first fluid $\underline{A}$ than the second fluid $\underline{B}$. Due to electrowetting, the wettability by the second fluid $\underline{B}$ varies under the application of a voltage between the first electrode and the second electrode, which tends to change the contact angle of the meniscus at the three phase line (the line of contact between the fluid contact layer 10 and the two liquids $\underline{A}$ and $\underline{B}$). The shape of the meniscus is thus variable in dependence on the applied voltage.

Referring now to FIG. 2: when a low voltage V1, e.g. between 0 V and 20 V, is applied between the electrodes, the meniscus adopts a first concave meniscus shape. In this configuration, the initial contact angle Q1 between the meniscus and the fluid contact layer 10, measured in the fluid $\underline{B}$, is for example approximately 140°. Due to the higher refractive index of the first fluid $\underline{A}$ than the second fluid $\underline{B}$, the lens formed by the meniscus, here called meniscus lens, has a relatively high negative power in this configuration.

To reduce the concavity of the meniscus shape, a higher magnitude of voltage is applied between the first and second electrodes. Referring now to FIG. 3, when an intermediate voltage V2, e. g. between 20 V and 150 V, depending on the thickness of the insulating layer, is applied between the electrodes, the meniscus adopts a second concave meniscus shape having a radius of curvature increased in comparison with the meniscus in FIG. 2. In this configuration, the intermediate contact angle Q2 between the first fluid $\underline{A}$ and the fluid contact layer 10 is for example approximately 100°. Due to the higher refractive index of the first fluid $\underline{A}$ than the second fluid $\underline{B}$, the meniscus lens in this configuration has a relatively low negative power.

To produce a convex meniscus shape, a yet higher magnitude of voltage is applied between the first and second electrodes. Referring now to FIG. 4, when a relatively high voltage V3, e. g. 150 V to 200 V, is applied between the electrodes the meniscus adopts a meniscus shape in which the meniscus is convex. In this configuration, the maximum contact angle Q3 between the first fluid $\underline{A}$ and the fluid contact layer 10 is for example approximately 60°. Due to the higher refractive index of the first fluid $\underline{A}$ than the second fluid $\underline{B}$, the meniscus lens in this configuration has a positive power.

By selecting an oil with a higher surface tension, and/or by adding a component, such as ethylene glycol, to the salt solution which reduces its surface tension, the initial contact angle may be decreased; in this case the lens may adopt a low optical power configuration corresponding to that shown in FIG. 3, and an intermediate power configuration corresponding to that shown in FIG. 4.

Although the fluid $\underline{A}$ has a higher refractive index than fluid $\underline{B}$ in the above example, the fluid $\underline{A}$ may also have a lower refractive index than fluid $\underline{B}$. For example, the fluid A may be a (per)fluorinated oil, which has a lower refractive index than water. In this case the amorphous fluoropolymer layer is preferably not used, because it might dissolve in fluorinated oils. An alternative fluid contact layer is e.g. a paraffin coating.

The method of manufacturing the set of lenses may vary and, to an extent, may depend on the size of the lenses in the set of lenses. In an embodiment, for instance an embodiment where the size of the lenses is relatively small (e.g. where the set of lenses constitutes a microlens array), the set of lenses may be manufactured using lithographic processes. To apply the voltages to individually control the lenses in a lens set, in an embodiment a scheme with address and data lines, switching transistors and storage capacitors can be used to limit the number of connections to the lens set, e.g. like is done in TFT LCD displays.

Exposure System with Set of Lenses

Figure 5:
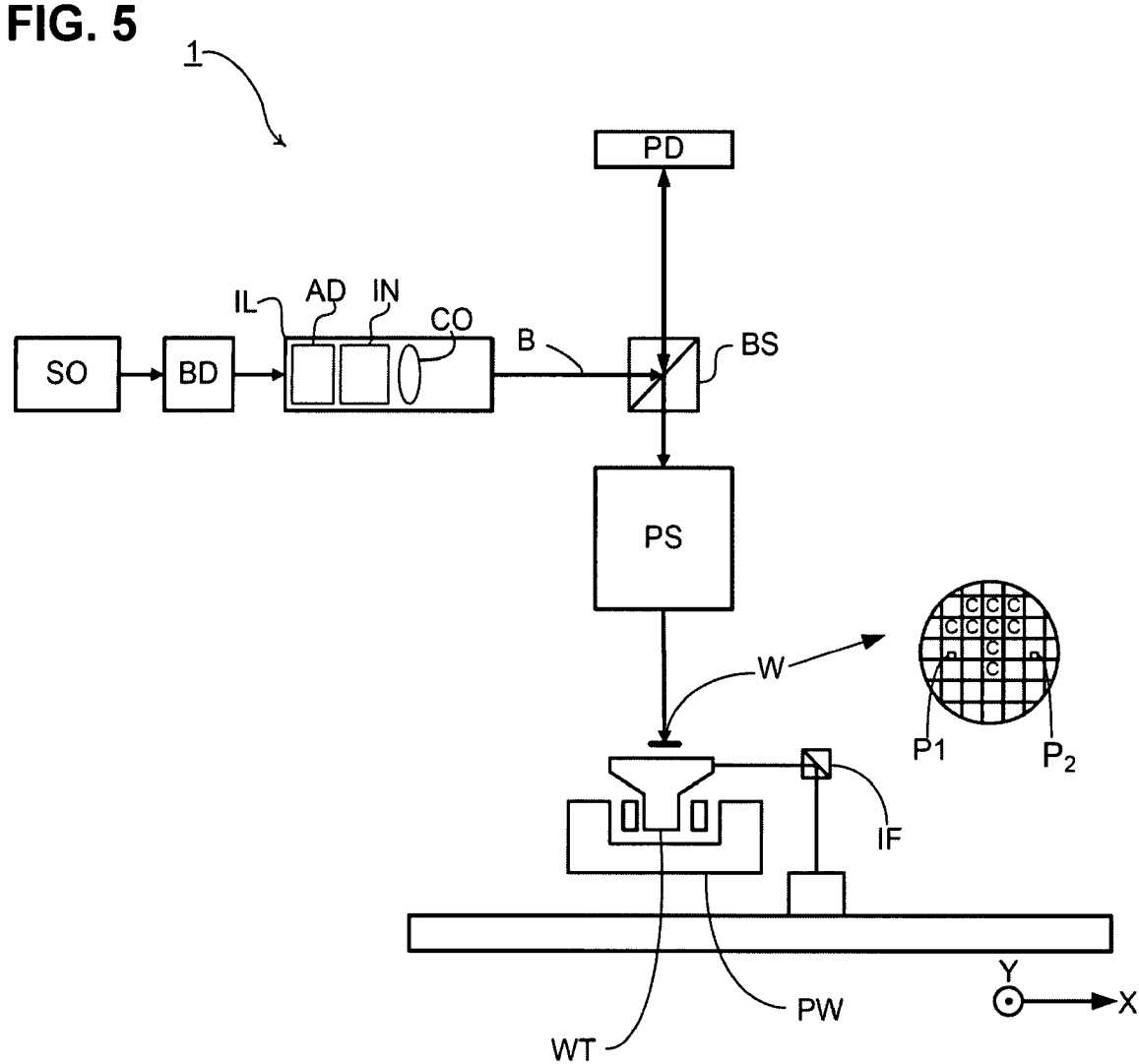
FIG. 5 depicts a lithographic apparatus according to an embodiment of the invention.

FIG. 5 schematically depicts a lithographic apparatus 1 according to an embodiment of the invention. The apparatus comprises:

an illumination system (illuminator) IL configured to condition a radiation beam B (e.g. UV radiation);

a patterning device PD (e.g. an array of individually controllable elements) that modulates the projection beam; in general the position of the array of individually controllable elements will be fixed relative to item PS; however it may instead be connected to a positioner configured to accurately position the array of individually controllable elements in accordance with certain parameters; the lithographic apparatus may comprise one or more patterning devices, e.g. one or more contrast devices. For example, it may have a plurality of arrays of individually controllable elements, e.g. each controlled independently of each other. In such an arrangement, some or all of the arrays of individually controllable elements may have at least one of a common illumination system (or part of an illumination system), a common support structure for the arrays of individually controllable elements and/or a common projection system (or part of the projection system).

a substrate table WT constructed to support a substrate (e.g. a resist-coated substrate) W and connected to a positioner PW configured to accurately position the substrate in accordance with certain parameters; and a projection system (e.g. a refractive projection lens system) PS configured to project the beam of radiation modulated by the array of individually controllable elements onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The term "patterning device", used herein should be broadly interpreted as referring to any device that can be used to modulate the cross-section of a radiation beam (e.g. to create a pattern in a target portion of the substrate). It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays. Patterning devices whose pattern is programmable with the aid of electronic means (e.g., a computer), such as patterning devices comprising a plurality of programmable elements that can each modulate the intensity of a portion of the radiation beam, (e.g., all the devices mentioned in the previous sentence except for the reticle), including electronically programmable patterning devices having a plurality of programmable elements that impart a pattern to the radiation beam by modulating the phase of a portion of the radiation beam relative to adjacent portions of the radiation beam, may collectively be referred to herein as "contrast devices". In an embodiment, the patterning device comprises at least 10 programmable elements, e.g. at least 100, at least 1000, at least 10000, at least 100000, at least 1000000, or at least 10000000 programmable elements. Embodiments of several of these devices are discussed in some more detail below:

A programmable mirror array. This may comprise a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate spatial filter, the said undiffracted light can be filtered out of the reflected beam, leaving only the diffracted light to reach the substrate; in this manner, the beam becomes patterned according to the addressing pattern of the matrix-addressable surface. It will be appreciated that, as an alternative, the filter may filter out the diffracted light, leaving the undiffracted light to reach the substrate. An array of diffractive optical MEMS devices may also be used in a corresponding manner. A diffractive optical MEMS device is comprised of a plurality of reflective ribbons that may be deformed relative to one another to form a grating that reflects incident light as diffracted light. A further alternative embodiment of a programmable mirror array employs a matrix arrangement of tiny mirrors, each of which may be individually tilted about an axis by applying a suitable localized electric field, or by employing piezoelectric actuation means. Once again, the mirrors may be matrix-addressable, such that addressed mirrors reflect an incoming radiation beam in a different direction to unaddressed mirrors; in this manner, the reflected beam may be patterned according to the addressing pattern of the matrix-addressable mirrors. The matrix addressing may be performed using suitable electronic means. More information on mirror arrays as here referred to can be gleaned, for example, from U.S. Pat. No. 5,296,891 and US 5,523,193, and PCT patent applications WO 98/38597 and WO 98/33096, which are incorporated herein by reference in their entirety.

A programmable LCD array. An example of such a construction is given in U.S. Pat. No. 5,229,872, which is incorporated herein by reference in its entirety.

In an embodiment, such as the embodiment depicted in FIG. 5, the substrate W has a substantially circular shape, optionally with a notch and/or a flattened edge along part of its perimeter. In an embodiment, the substrate has a polygonal shape, e.g. a rectangular shape. Embodiments where the substrate has a substantially circular shape include embodiments where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm. Embodiments where the substrate is polygonal, e.g. rectangular, include embodiments where at least one side, e.g. at least 2 sides or at least 3 sides, of the substrate has a length of at least 5 cm, e.g. at least 25 cm, at least 50 cm, at least 100 cm, at least 150 cm, at least 200 cm, or at least 250 cm. In an embodiment, at least one side of the substrate has a length of at most 1000 cm, e.g. at most 750 cm, at most 500 cm, at most 350 cm, at most 250 cm, at most 150 cm, or at most 75 cm. In an embodiment, the substrate is a rectangular substrate having a length of about 250-350 cm and a width of about 250-300 cm The thickness of the substrate may vary and, to an extent, may depend, e.g., on the substrate material and/or the substrate dimensions. In an embodiment, the thickness is at least 50 μm, for instance at least 100 μm, at least 200 μm, at least 300 μm, at least 400 μm, at least 500 μm, or at least 600 μm. In one embodiment, the thickness of the substrate is at most 5000 μm, for instance at most 3500 μm, at most 2500 μm, at most 1750 μm, at most 1250 μm, at most 1000 μm, at most 800 μm, at most 600 μm, at most 500 μm, at most 400 μm, or at most 300 μm. The substrate referred to herein may be processed, before or after exposure, in for example a track (a tool that typically applies a layer of resist to a substrate and develops the exposed resist). Properties of the substrate may be measured before or after exposure, for example in a metrology tool and/or an inspection tool.

In an embodiment, a resist layer is provided on the substrate. In an embodiment, such as the embodiment shown in FIG. 5, the substrate W is a wafer, for instance a semiconductor wafer. In an embodiment, the wafer material is selected from the group consisting of Si, SiGe, SiGeC, SiC, Ge, GaAs, InP, and InAs. In an embodiment, the wafer is a III/V compound semiconductor wafer. In an embodiment, the wafer is a silicon wafer. In an embodiment, the substrate is a ceramic substrate. In an embodiment, the substrate is a glass substrate. Glass substrates may be useful, e.g., in the manufacture of flat panel displays and liquid crystal display panels. In an embodiment, the substrate is a plastic substrate. In an embodiment, the substrate is transparent (for the naked human eye). In an embodiment, the substrate is colored. In an embodiment, the substrate is absent a color. In an embodiment, the substrate is flexible.

The projection system may image secondary sources for which the elements of the array of individually controllable elements act as shutters. In this respect, the projection system may comprise a set of lenses, for instance a micro lens array (MLA), e.g. to form the secondary sources and to image spots onto the substrate. The set of lenses comprises variable lenses. In an embodiment, the set comprises at least 10 lenses, e.g. at least 100 lenses, at least 1000 lenses, at least 10000 lenses, at least 100000 lenses, or at least 1000000 lenses. In an embodiment, the set is a microlens array. In an embodiment, the majority of lenses in the set are variable lenses, e.g. about all lenses in the array. In an embodiment, the set comprises at least 10 variable lenses, e.g. at least 100 variable lenses, at least 1000 variable lenses, at least 10000 variable lenses, at least 100000 variable lenses, or at least 1000000 variable lenses.

Examples of sets of lenses having variable lenses include those comprising, e.g., variable lenses based on the electrowetting effect (e.g. as described above under the section "set of lenses") and/or variable lenses having liquid crystals, e.g. polymer network liquid crystals. Regarding microlenses using liquid crystals, see, e.g., Hongwen Ren et al. in Optics Communications, 230 (2004), p. 267-271.

In an embodiment, the number of individually controllable elements in the patterning device is equal to or greater than the number of lenses in the set of lenses. In an embodiment, the set of lenses comprises a lens that is optically associated with one or more of the individually controllable elements in the array of individually controllable elements, e.g. with 2 or more of the individually controllable elements in the array of individually controllable elements, such as 3 or more, 5 or more, 10 or more, 20 or more, 25 or more, 35 or more, or 50 or more; in an embodiment, the lens is optically associated with less than 5000 individually controllable elements, e.g. less than 2500, less than 1000, less than 500, or less than 100. In an embodiment, the set of lenses comprises more than one lens (e.g. more than 1000, the majority, or about all) that is optically associated with one or more of the individually controllable elements in the array of individually controllable elements. In an embodiment, different lenses in the set of lenses are associated with different sections (with sections comprising 1 or more individually controllable elements) in the array of individually controllable elements.

As here depicted, the apparatus is of a reflective type (e.g. employing a reflective array of individually controllable elements). Alternatively, the apparatus may be of a transmissive type (e.g. employing a transmissive array of individually controllable elements).

The apparatus may be of a type having two (dual stage) or more substrate tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by an "immersion liquid" having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 5, the illuminator IL receives a radiation beam from a radiation source SO. In an embodiment, the radiation source provides radiation having a wavelength of at least 5 nm, e.g. at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In an embodiment, the radiation provided by radiation source SO has a wavelength of at most 450 nm, e.g. at most 425 nm, at most 375 nm, at most 360 nm, at most 325 nm, at most 275 nm, at most 250 nm, at most 225 nm, at most 200 nm, or at most 175 nm. In an embodiment, the radiation has a wavelength including 436 nm, 405 nm, 365 nm, 355 nm, 248 nm, 193 nm, 157 nm, 126 nm, and/or 13.5 nm. In an embodiment, the radiation includes a wavelength of around 365 nm or around 355 nm. In an embodiment, the radiation includes a broad band of wavelengths, for example encompassing 365, 405 and 436 nm. A 355 nm laser source could be used. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if present, may be referred to as a radiation system. If the patterning device is a light source itself, e.g. a laser diode array or a light emitting diode array, the apparatus may be designed without an illumination system or at least a simplified illumination system (e.g., the need for radiation source SO may be obviated).

The illuminator IL, may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross-section. The illuminator IL, or an additional component associated with it, may also be arranged to divide the radiation beam into a plurality of sub-beams that may, for example, each be associated with one or a plurality of the individually controllable elements of the array of individually controllable elements. A two-dimensional diffraction grating may, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g. an interferometric device, linear encoder or capacitive sensor), the substrate table WT can be moved accurately, e.g. so as to position different target portions C in the path of the radiation beam B. Where used, the positioning means for the array of individually controllable elements can be used to correct accurately the position of the patterning device PD with respect to the path of the beam B, e.g. during a scan. In an embodiment, movement of the substrate table WT is realized with the aid of a long-stroke module (course positioning) and a short-stroke module (fine positioning), which are not explicitly depicted in FIG. 5. In an embodiment, the apparatus is absent at least a short stroke module for moving substrate table WT. A similar system may also be used to position the array of individually controllable elements. It will be appreciated that the projection beam B may alternatively/additionally be moveable while the object table and/or the array of individually controllable elements may have a fixed position to provide the relative movement. Such an arrangement may assist in limiting the size of the apparatus. As a further alternative, which may e.g. be applicable in the manufacture of flat panel displays, the position of the substrate table WT and the projection system PS may be fixed and the substrate W may be arranged to be moved relative to the substrate table WT. For example, the substrate table WT may be provided with a system for scanning the substrate W across it at a substantially constant velocity.

As shown in FIG. 5, the beam of radiation B may be directed to the patterning device PD by means of a beam splitter BS configured such that the radiation is initially reflected by the beam splitter and directed to the patterning device PD. It should be realized that the beam of radiation B may also be directed at the patterning device without the use of a beam splitter. In an embodiment, the beam of radiation is directed at the patterning device at an angle between 0 and 90°, e.g. between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements may be used to direct the beam of radiation B to the patterning device PD and subsequently to the projection system PS. In particular, an arrangement such as is shown in FIG. 5 may not be required if a transmissive patterning device is used.

The depicted apparatus may be used in, e.g., the following four modes:

1. In step mode, the array of individually controllable elements and the substrate are kept essentially stationary, while an entire pattern imparted to the radiation beam is projected onto a target portion C at one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e. a single dynamic exposure). The velocity and direction of the substrate relative to the array of individually controllable elements may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projection beam B is caused to scan a line across the substrate W. The pattern on the array of individually controllable elements is updated between pulses of the radiation system and the pulses are timed such that successive target portions C are exposed at the desired locations on the substrate W. Consequently, the projection beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the projection beam B scans across the substrate W and exposes it. A substantially constant radiation source or a pulsed radiation source, synchronized to the updating of the pattern on the array of individually controllable elements may be used.

Combinations and/or variations on the above described modes of use or entirely different modes of use may also be employed.

In lithography, a desired feature may be created on a substrate by selectively exposing a layer of resist on a substrate to radiation, e.g. by exposing the layer of resist to patterned radiation. Areas of the resist receiving a certain minimum light dose ("dose threshold") undergo a chemical reaction, whereas other areas remain unchanged. The thus created chemical differences in the resist layer allow for developing the resist, i.e. selectively removing either the areas having received at least the minimum dose or removing the areas that did not receive the minimum dose. As a result, part of the substrate is still protected by a resist whereas the areas of the substrate from which resist is removed are exposed, allowing e.g. for additional processing steps such as selective etching of the substrate, selective metal deposition, etc. thereby creating the desired feature. Patterning the radiation may be effected by setting the individually controllable elements in a patterning device such that the radiation that is transmitted to an area of the resist layer on the substrate within the desired feature is at a sufficiently high intensity that the area receives a dose of radiation above the dose threshold during the exposure, whereas other areas on the substrate receive a radiation dose below the dose threshold by setting the corresponding individually controllable elements to provide a zero or significantly lower radiation intensity.

In practice, the radiation dose at the edges of the desired feature may not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose may drop off across a transition zone. The position of the boundary of the desired feature ultimately formed after developing the resist is then determined by the position at which the received dose drops below the radiation dose threshold. The profile of the drop-off of radiation dose across the transition zone, and hence the precise position of the feature boundary, can be controlled more precisely by setting the individually controllable elements that provide radiation to points on the substrate that are on or near the feature boundary not only to maximum or minimum intensity levels but also to intensity levels between the maximum and minimum intensity levels. This is commonly referred to as "grayscaling" or "grayleveling".

Grayscaling may provide greater control of the position of the feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g. at least 4 radiation intensity values, at least 8 radiation intensity values, at least 16 radiation intensity values, at least 32 radiation intensity values, at least 64 radiation intensity values, at least 100 radiation intensity values, at least 128 radiation intensity values, or at least 256 radiation intensity values. If the contrast device is a light source itself (e.g. an array of light emitting diodes or laser diodes), grayscaling may be effected, e.g., by controlling the intensity levels of the light being transmitted. If the contrast device is a micromirror device, grayscaling may be effected, e.g., by controlling the tilting angles of the micromirrors. Also, grayscaling may be effected by grouping a plurality of programmable elements in the contrast device and controlling the number of elements within the group that are switched on or off at a given time.

It should be appreciated that grayscaling may be used for additional or alternative purposes to that described above. For example, the processing of the substrate after the exposure may be tuned such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling may be used to provide a radiation dose profile across the substrate having more than two desired dose levels. In an embodiment, the radiation dose profile has at least 2 desired dose levels, e.g. at least 3 desired radiation dose levels, at least 4 desired radiation dose levels, at least 6 desired radiation dose levels or at least 8 desired radiation dose levels.

It should further be appreciated that the radiation dose profile may be controlled by methods other than by merely controlling the intensity of the radiation received at each point on the substrate, as described above. For example, the radiation dose received by each point on the substrate may alternatively or additionally be controlled by controlling the duration of the exposure of said point. As a further example, each point on the substrate may potentially receive radiation in a plurality of successive exposures. The radiation dose received by each point may, therefore, be alternatively or additionally controlled by exposing said point using a selected subset of said plurality of successive exposures.

In an embodiment, at least part of the desired greyscaling is achieved by focal length control of the lens system, e.g. by controllably adjusting the focal length of one or more variable lenses in the set of lenses. For instance, for the "off" state, a pixel can be focused on a stop in the projection optics. Gray value control may be realized by the changing the focal length of a variable lens associated with the pixel so that more or less light is blocked by the stop.

When e.g. relatively thick resists are used, it may be desirable to focus the projected image at different heights in the resist, for instance to activate the resist more uniformly in height. This scheme is sometimes referred to as "focus drilling", and is generally done by modulating the wavelength of the light source. Using a set of lenses having comprising individually controllable lenses, focus drilling may be performed by modulating the focal length of the variable lenses during an exposure.

In order to form the pattern on the substrate, it is necessary to set each of the individually controllable elements in the patterning device to the requisite state at each stage during the exposure process. Therefore control signals, representing the requisite states, must be transmitted to each of the individually controllable elements. In an embodiment, the lithographic apparatus includes a controller that generates the control signals. The pattern to be formed on the substrate may be provided to the lithographic apparatus in a vector-defined format such as GDSII. In order to convert the design information into the control signals for each individually controllable element, the controller includes one or more data manipulation devices, each configured to perform a processing step on a data stream that represents the pattern. The data manipulation devices may collectively be referred to as the "datapath".

The data manipulation devices of the datapath may be configured to perform one or more of the following functions: converting vector-based design information into bitmap pattern data; converting bitmap pattern data into a radiation dose map (namely a radiation dose profile across the substrate); converting a radiation dose map into radiation intensity values for the individually controllable elements; and converting the radiation intensity values for the individually controllable elements into corresponding control signals.

Figure 6:
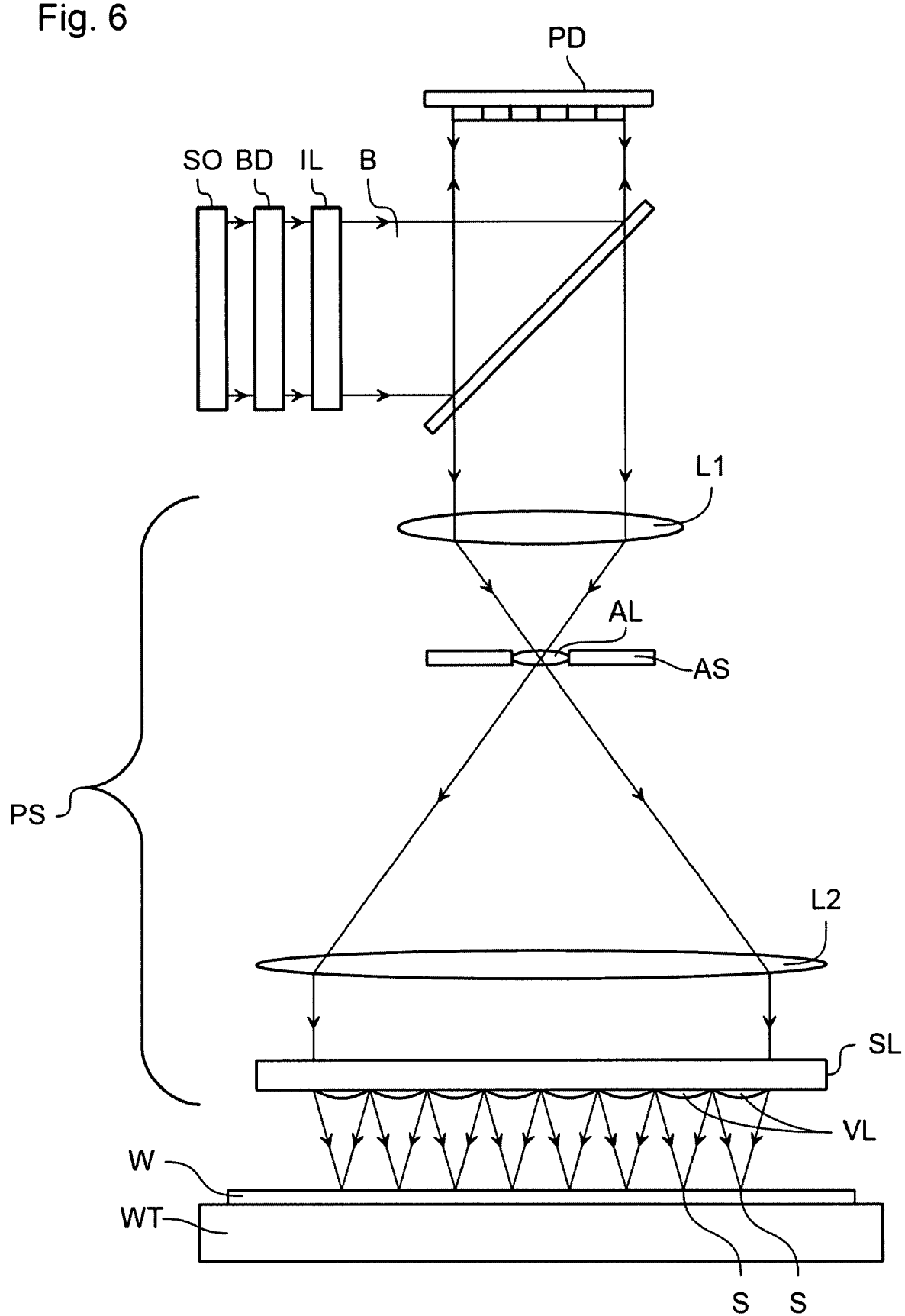
FIG. 6 depicts a lithographic apparatus according to another embodiment of the invention.

FIG. 6 depicts an embodiment of an apparatus according to the present invention that may be used, e.g., in the manufacture of flat panel displays. Components corresponding to those shown in FIG. 5 are depicted with the same reference numerals. Also, the above descriptions of the various embodiments, e.g. the various configurations of the substrate, the contrast device, the set of lenses (e.g. MLA), the beam of radiation, etc., remain applicable.

As shown in FIG. 6 the apparatus comprises a radiation source SO, a beam delivery system BD, an illuminator IL, and a projection system PS. The projection system PS includes a beam expander, which comprises two lenses L1, L2. The first lens L1 is arranged to receive the modulated radiation beam B and focus it through an aperture in an aperture stop AS. A further lens AL may be located in the aperture. The radiation beam B then diverges and is focused by the second lens L2 (e.g., a field lens).

The projection system PS further comprises a set of lenses SL arranged to receive the expanded modulated radiation B. Different portions of the modulated radiation beam B, corresponding to one or more of the individually controllable elements in the patterning device PD, pass through respective different lenses in the set of lenses SL. Each lens VL focuses the respective portion of the modulated radiation beam B to a point that lies on the substrate W. In this way an array of radiation spots S is exposed onto the substrate W. It will be appreciated that, although only eight lenses VL of the illustrated set of lenses SL are shown, the array of lenses may comprise many thousands of lenses (the same is true of the array of individually controllable elements used as the patterning device PD). In the embodiment depicted in FIG. 6, the modulated beam impinges perpendicularly on the set of lenses SL. In another embodiment, the modulated beam is angled towards the set of lenses SL.

Figure 7:
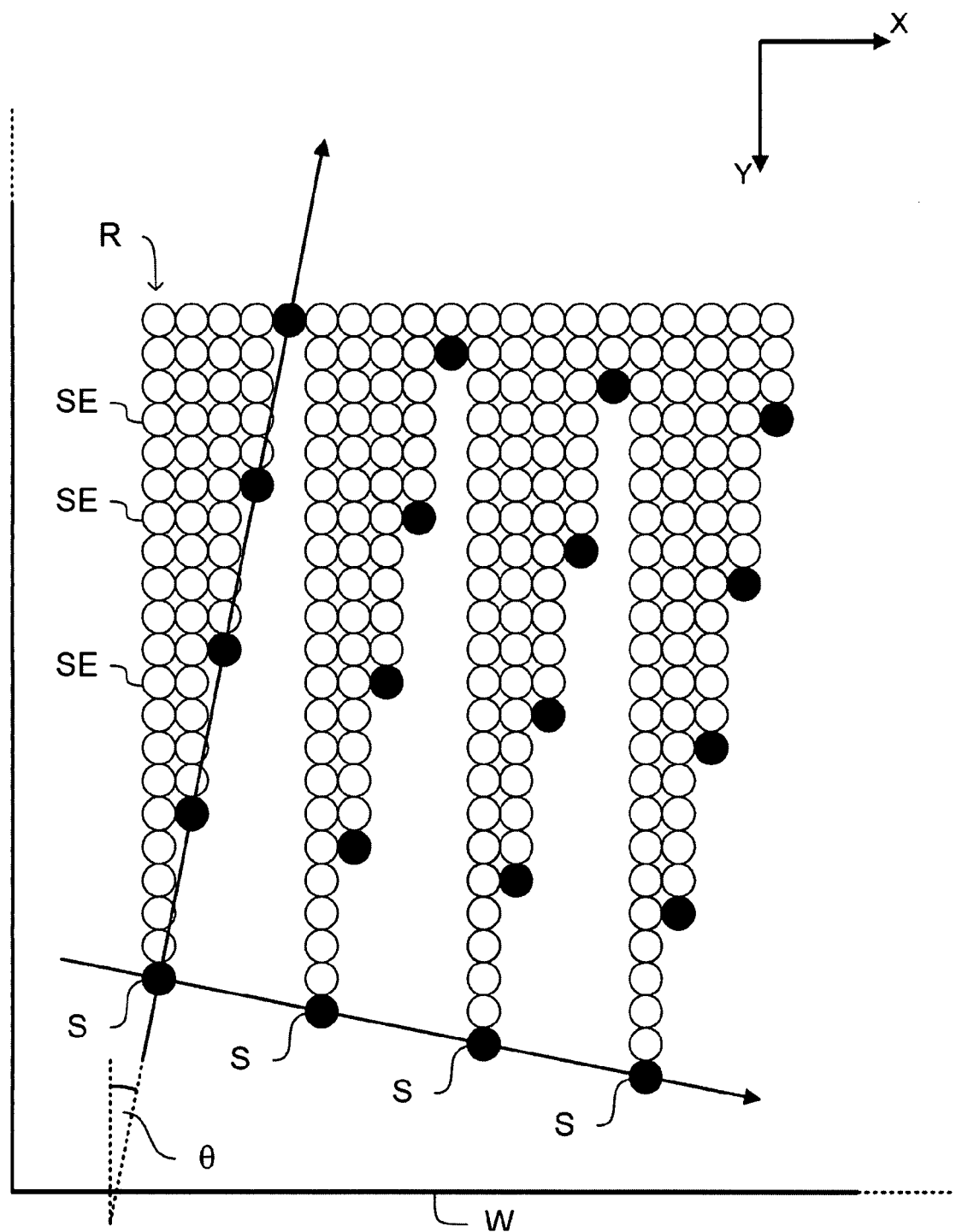
FIG. 7 depicts a mode of transferring a pattern to a substrate using an embodiment of the invention as show in FIG. 6.

FIG. 7 illustrates schematically how the pattern on the substrate W may be generated. The filled in circles represent the array of spots S projected onto the substrate by the set of lenses SL in the projection system PS. The substrate is moved relative to the projection system in the Y direction as a series of exposures are exposed on the substrate. The open circles represent spot exposures SE that have previously been exposed on the substrate. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging." It will be appreciated that FIG. 3 is a schematic drawing and that spots S may overlap in practice.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots S. In an embodiment, the angle θ is at most 20°, 10°, for instance at most 5°, at most 3°, at most 1°, at most 0.5°, at most 0.25°, at most 0.10°, at most 0.05°, or at most 0.01°. In an embodiment, the angle θ is at least 0.0001°, e.g. at least 0.001°.

Figure 8:
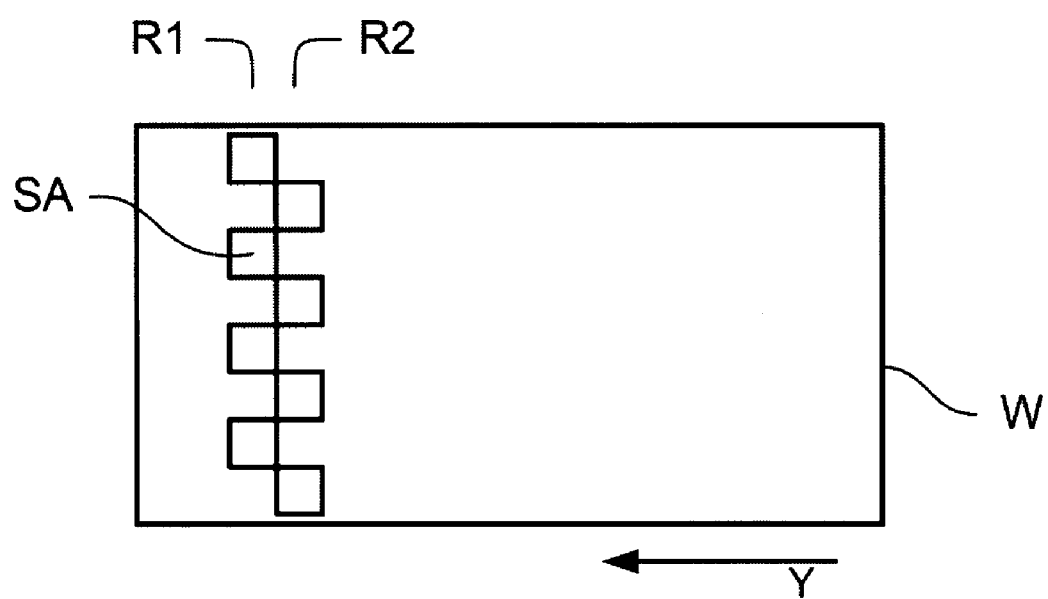
FIG. 8 depicts an arrangement of optical engines according to an embodiment of the invention.

FIG. 8 shows schematically how an entire flat panel display substrate W may be exposed in a single scan, by using a plurality of optical engines. Eight arrays SA of radiation spots S (not shown) are produced by eight optical engines, arranged in two rows R1, R2 in a 'chess board' configuration such that the edge of one array of radiation spots S slightly overlaps with the edge of the adjacent array of radiation spots S. In an embodiment, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines may be used. In an embodiment, the number of optical engines is at least 1, for instance at least 2, at least 4, at least 8, at least 10, at least 12, at least 14, or at least 17. In an embodiment, the number of optical engines is less than 40, e.g. less than 30 or less than 20.

Each optical engine may comprise a separate illumination system IL, patterning device PD and projection system PS as described above. It is to be appreciated, however, that two or more optical engines may share at least a part of one or more of the illumination system, patterning device and projection system.

Although specific reference may be made in this text to the use of lithographic apparatus in the manufacture of a specific device (e.g. an integrated circuit or a flat panel display), it should be understood that the apparatus described herein may have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus may be used to assist in the creation of a variety of layers, e.g. a thin film transistor layer and/or a color filter layer.

Having described specific embodiments of the present invention, it will be understood that many modifications thereof will readily appear or may be suggested to those skilled in the art, and it is intended therefore that this invention is limited only by the spirit and scope of the following claims.

The invention claimed is:

1. A microlens array, comprising:
   a matrix of lenses arranged in rows and columns; and
   a first liquid and a second liquid associated with the matrix of lenses, wherein a focal position of respective lenses in the microlens array is controlled by applying a voltage to the lenses using address/data lines coupled to respective ones of the lenses of the microlens array using a data/address scheme, and
   wherein the first liquid and the second liquid are substantially immiscible and have different refractive indices.

2. The microlens array of claim 1, wherein the first liquid is an aqueous liquid.

3. The microlens array of claim 1, wherein the second liquid is an oil.

4. The microlens array of claim 1, wherein the matrix of lenses comprises at least 100 lenses.

5. The microlens array of claim 1 included in a lithography system.

6. A lithography apparatus, comprising:
   an illumination system;
   a patterning device;
   a projection system including a microlens array, the microlens array comprising,
      a matrix of lenses arranged in rows and columns; and
      a first liquid and a second liquid associated with the matrix of lenses, wherein a focal position of respective lenses in the microlens array is controlled by applying a voltage to the lenses using address/data lines coupled to respective ones of the lenses of the microlens array using a data/address scheme, and
   wherein the first liquid and the second liquid are substantially immiscible and have different refractive indices.

7. A device manufacturing method, comprising:
   controlling a focal position of a matrix of lenses arranged in rows and columns having a first liquid and a second liquid in a microlens array by applying a voltage to respective ones of the matrix of lenses using address/data lines coupled to respective ones of the lenses of the microlens array using a data/address scheme, and
   wherein the first liquid and the second liquid are substantially immiscible and have different refractive indices; and
   exposing a substrate to radiation using the microlens array.

8. The lithographic apparatus of claim 6, wherein the first liquid is an aqueous liquid.

9. The lithographic apparatus of claim 6, wherein the second liquid is an oil.

10. The lithographic apparatus of claim 6, wherein the matrix of lenses comprises at least 100 lenses.

* * * * *